United States Patent
Bermak et al.

(10) Patent No.: US 8,629,386 B2
(45) Date of Patent: Jan. 14, 2014

(54) METHOD AND APPARATUS FOR ENERGY HARVESTING USING CMOS SENSOR

(75) Inventors: Amine Bermak, Hong Kong (CN); Chao Shi, Hong Kong (CN); Man Kay Law, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 856 days.

(21) Appl. No.: 12/711,034

(22) Filed: Feb. 23, 2010

(65) Prior Publication Data

US 2010/0219789 A1    Sep. 2, 2010

Related U.S. Application Data

(60) Provisional application No. 61/202,435, filed on Feb. 27, 2009.

(51) Int. Cl.
*H01L 27/00* (2006.01)
(52) U.S. Cl.
USPC .................................. 250/208.1; 250/214.1
(58) Field of Classification Search
USPC ........................................ 320/101; 250/208.1
See application file for complete search history.

(56) References Cited

U.S. PATENT DOCUMENTS

| | | | | |
|---|---|---|---|---|
| 6,635,857 | B1 * | 10/2003 | Kindt | 250/208.1 |
| 6,803,553 | B1 * | 10/2004 | Tian | 250/208.1 |
| 7,405,763 | B2 | 7/2008 | Wu | |
| 2006/0028333 | A1 * | 2/2006 | Tyndall | 340/447 |

OTHER PUBLICATIONS

Guilar et al., "Integrated solar energy harvesting and storage," IEEE Transactions on Very Large Scale Integration (VLSI) Systems, 17 (5): 627-637 (May 2009).
Shi et al., "A CMOS image sensor with reconfigurable resolution for energy harvesting applications," IEEE Sensors 2009 Conference (Oct. 26, 2009).
Shi et al., "A novel asynchronous pixel for an energy harvesting CMOS image sensor," IEEE Transactions on Very Large Scale Integration, available at http://ieeexplore.ieee.org (Oct. 6, 2009).
Shoushun et al., "Arbitrated time-to-first spike CMOS image sensor with on-chip histogram equalization," IEEE Transactions on Very Large Scale Integration (VLSI) Systems, 15 (3): 346-357 (Mar. 2007).
Fish et al., "Self-powered active pixel sensors for ultra low-power applications," Proc. IEEE Int. Symp. Circuits Syst. (ISCAS), 5310-5313 (2005).
Fish et al., "CMOS image sensors with self-powered generation capability," IEEE Transactions on Circuits and Systems, 53 (11): 1210-1214 (2006).

* cited by examiner

*Primary Examiner* — Edward Tso
*Assistant Examiner* — Johali Torres Ruiz
(74) *Attorney, Agent, or Firm* — Leydig, Voit & Mayer, Ltd.

(57) ABSTRACT

An apparatus using reconfigurable integrated sensor elements with an efficient energy harvesting capability is described. Each sensor element has sensing and energy harvesting mode. In the sensing mode, the sensor element measures an environmental characteristic by generating electrical charge and outputs a time-encoded signal indicative of the measurement. In the energy harvesting mode, the sensor element itself is used to harvest energy from ambient energy source and makes it available to other sensor elements or circuit components. The sensing element is switched from the sensing mode to the energy harvesting mode when the electrical charge reaches a predetermined threshold. An image sensor device using asynchronous readout for harvesting energy from incident light while generating images is also described.

28 Claims, 10 Drawing Sheets

METHOD AND APPARATUS FOR ENERGY HARVESTING USING CMOS SENSOR

CROSS-REFERENCE TO RELATED APPLICATIONS

This patent application claims the benefit of U.S. Provisional Patent Application No. 61/202,435, filed Feb. 27, 2009, which is incorporated by reference in its entirety.

FIELD OF THE INVENTION

The present invention relates in general to the fields of electronic sensors and in particular to reconfigurable integrated sensors as both sensing and energy harvesting elements, and to an asynchronous readout technique for efficiently harvesting ambient energy using the sensors.

BACKGROUND OF THE INVENTION

Integrated sensors can convert environmental energy into electrical signals, and some of them, as in the case of integrated image sensors, can be used for both sensing and energy harvesting. In the last decade, CMOS image sensors have gained attention due to their inherent advantages of low power and low cost. This is mainly due to the use of standard Complementary Metal Oxide Semiconductor (CMOS) technology which allows for integrating image capture devices as well as complex image processing circuits on a single chip.

CMOS image sensors have a variety of applications in modern portable/mobile electronic systems and sensor networks. These systems are usually powered by batteries or external power supplies. Therefore, power consumption is a major limitation in these portable/mobile systems since the capacity of the batteries often limits their operational time. In the case of sensor network, where the scarcest resource is energy, devices are expected to have a long operational time without human intervention for energy replenishment. Human intervention is undesirable due to the cost of checking a large number of devices. Low power has been typically achieved by using more advanced CMOS technologies featuring low power supply voltage. Low supply voltage, however, is not preferable in CMOS image sensors as it has an enormous impact on imaging performance due to limited signal swing and reduced signal-to-noise ratio (SNR).

Figure 1:
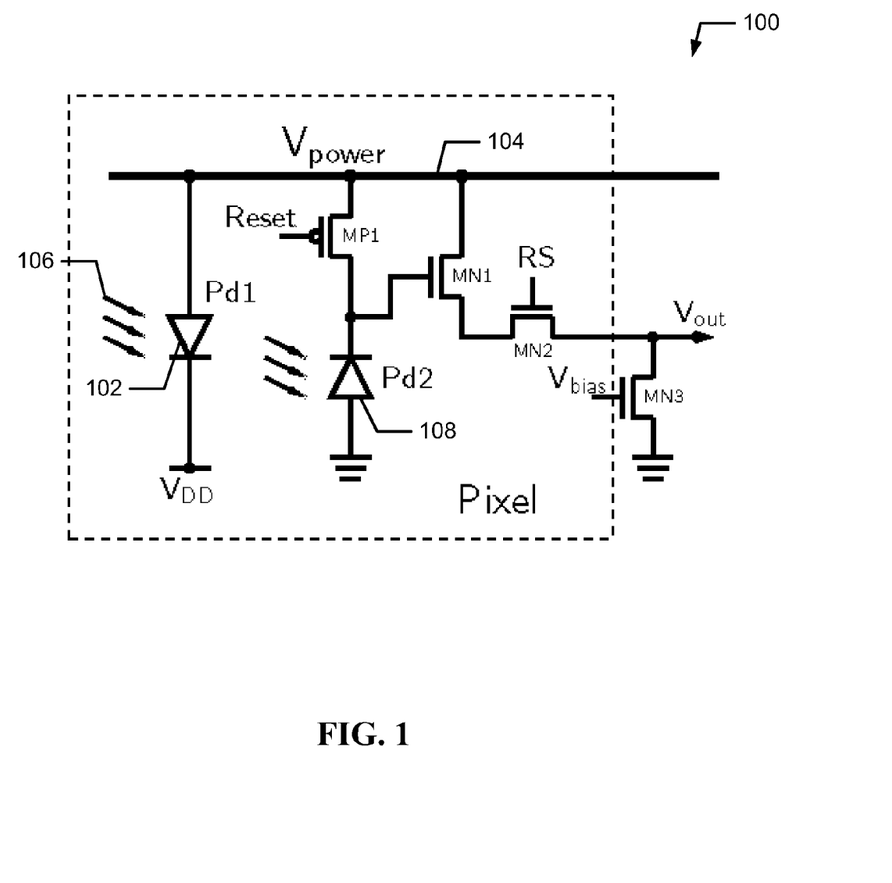
FIG. 1 depicts an existing technique for harvesting energy using a CMOS image sensor.

Energy harvesting technique can be utilized to exploit energy on-board, thus alleviating the requirement on external battery capacity. For example in CMOS image sensor, a Self-Powered Pixel (SPS) approach that exploits the energy generation capability of integrated photodiodes as shown in FIG. 1, has been previously studied. A photodiode Pd1 (102) is connected between a conventional power supply VDD 103 and a power bus 104 shared by all the pixels in the image sensor. When exposed to incident illumination 106, photodiode 102 converts photons into electron/hole pairs, forming photocurrents that provide extra power to power bus 104. Another photodiode Pd2 (108) and transistors MN1, MN2, and MP1 form a conventional active pixel sensor (APS) structure, in which photodiode 108 operates as the photodetector. MN3 provides a biasing current for signal readout. With the energy generated by the additional photodiode 102, the energy drained from the power supply can be reduced.

However, the existing approach suffers several drawbacks: 1) Significant silicon area is dedicated to the photodetector used for power generation. 2) Before each frame capture, the power photodetector is first charged-up. Poor illumination will elongate this period, thus leading to a very slow operation of the sensor. 3) The SPS cannot operate when the power bus drops below the minimum supply voltage, upon which the bus recharging cycle is invoked.

BRIEF SUMMARY OF THE INVENTION

Described herein are various embodiments of method and apparatus for utilizing integrated sensors to harvest energy from an ambient environment. The harvested energy can be used by the sensors to power components of the sensors or other circuit components, so that the power consumed from a conventional power supply is reduced. The harvested energy can also be stored in an on-chip energy storage device or in an external energy storage device for later use or for powering external circuits.

According to one embodiment, a sensor circuit, including a sensor array, is used to harvest energy from an ambient source. The sensors in the sensor array may be CMOS image sensors, piezoelectric sensors, or other sensors suitable for measuring environmental characteristics. The sensor circuit further includes a timing and control unit, one or more decoder and buffer units, and a signal processor and memory unit for implementing the required functionalities. The sensor circuit further includes a power management and energy storage unit for processing and storing the energy harvested by the sensor array.

According to another embodiment, a sensor element including a sensor, a control circuit, and an encoding circuit. The sensor element has first and second operating modes. In the first operating mode (i.e., the sensing mode), the sensor element is used for measuring the environmental characteristic by generating electrical charge. In the second operating mode (i.e., the energy harvesting mode), the sensor element is used as an energy harvesting device for using the electrical charge as a power supply. The sensor element is switched from the first operating mode to the second operating mode when the electrical charge reaches a predetermined threshold.

Unlike the conventional voltage domain sensing techniques, the sensor element utilizes a time encoding technique to convert the environmental characteristic into an output signal indicative of a charging time. In a further embodiment, when the sensor is a photodetector or a photodiode used for measuring incident light intensity, the charging time is a time interval inversely proportional to the light intensity. When exposed to the incident light, the sensor generates electrical charge in response to the incident light. When the electrical charge reaches a predetermined threshold, the sensor is configured to harvest energy from the incident light to electrical charge to supply power to the circuit components of the sensor element, external circuit components, or energy storage devices.

According to another embodiment, a method is provided for using an image sensor array to harvest energy from the light impinging on the sensor. The method utilizes an asynchronous readout technique, where highly illuminated pixels charge up quickly and the output signals are read out from these pixels first, due to the fact that the electrical charge reaches the predetermined threshold earlier in these pixels than in other pixels receiving lower illumination. Once the output signals are collected, these highly illuminated pixels are configured to harvest energy at earlier times than those pixels exposed to lower illumination. When a group of pixels are switch to the energy harvesting mode, the electrical charge in these pixels is used to contribute to the global power supply, thereby reducing power consumption from the main power supply. As the process continues, more and more pixels are switched to the energy harvesting mode, thereby creating an avalanche effect.

According to some embodiments, a method is provided for operating a sensor element, comprising setting the sensor element in a first operating mode for measuring an environmental characteristic by generating electrical charge in response to the environmental characteristic, generating an output signal in response to the electrical charge, determining that the electrical charge reaches a predetermined threshold, switching in response to the determination result the sensor element to a second operating mode for using the electrical charge as a power supply.

According to some alternative embodiments, an apparatus is provided comprising a sensing circuit having first and second operating modes, wherein the sensing circuit measures an environmental characteristic in the first operating mode by generating electrical charge and operates as a power supply in the second operating mode using the electrical charge, a control circuit connected to the sensing circuit for monitoring the electrical charge and for generating a feedback signal for switching the sensing circuit from the first to the second operating mode when the electrical charge reaches a predetermined threshold, and an encoding circuit connected to the control circuit for generating an output signal in response to the electrical charge.

According to still some alternative embodiments, an imaging sensor is provided, comprising an array of sensor units, each having first and second operating modes, wherein each sensor unit generates an output signal indicative of a light intensity received by the sensing unit in the first operating mode and operates as a power supply in the second operating mode, a timing circuit for providing control signals to switch each sensing unit between the first and second operating modes, and a processing circuit for selectively reading the output signals from the array of sensing units based on the operating modes of the sensing units.

DETAILED DESCRIPTION OF THE INVENTION

Figure 2:
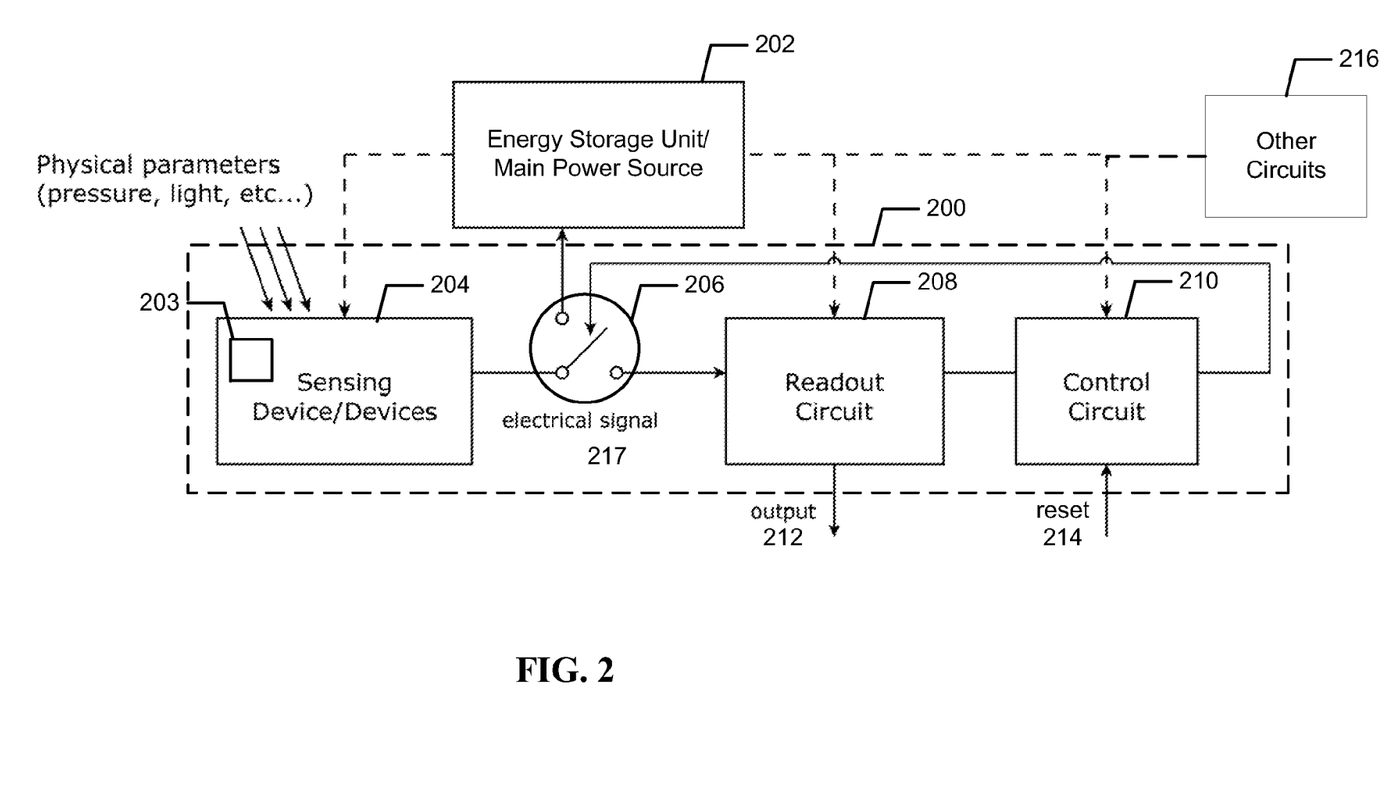
FIG. 2 illustrates a diagram of circuit for harvesting energy by using reconfigurable sensing devices having a sensing mode and an energy harvesting mode.

Now turning to the drawings and referring to FIG. 2, a block diagram is shown therein for illustrating the general structure of circuit 200 for harvesting energy from one or more sensing device 204. The circuit 200, which includes at least one sensing unit 203, can be switched between a sensing mode and a energy harvesting mode. In the sensing mode, the sensing unit 203 converts certain physical parameters or environmental characteristics such as light intensity, pressure, force, acceleration, into output signal 212 which is then read-out and digitized. In the energy harvesting mode, the sensing unit 203 is connected to the energy storage unit or main power source 202 to contribute to the power supply, which is used to power various components of the circuit 200 or other external circuit 216.

As further depicted in FIG. 2, the sensing unit 200 further includes switch 206 for selecting the sensing mode and the energy harvesting mode, a readout circuit 208 for reading and encoding the electrical signal 217 generated by the sensing device 204 into the output signal 212, and control circuit 210 for generating a feedback signal 207 for controlling the switch 206 in response to the electrical signal 217 and external reset signal 214.

According to some embodiments, the sensing device 204 is a photodiode for measuring incident light intensity and generating electrical charge in response to the incident light. In keeping with this embodiment, the circuit 200 is a light sensing element, commonly called pixel, integrated in an imaging device which is fabricated using the CMOS technique.

Figure 3:
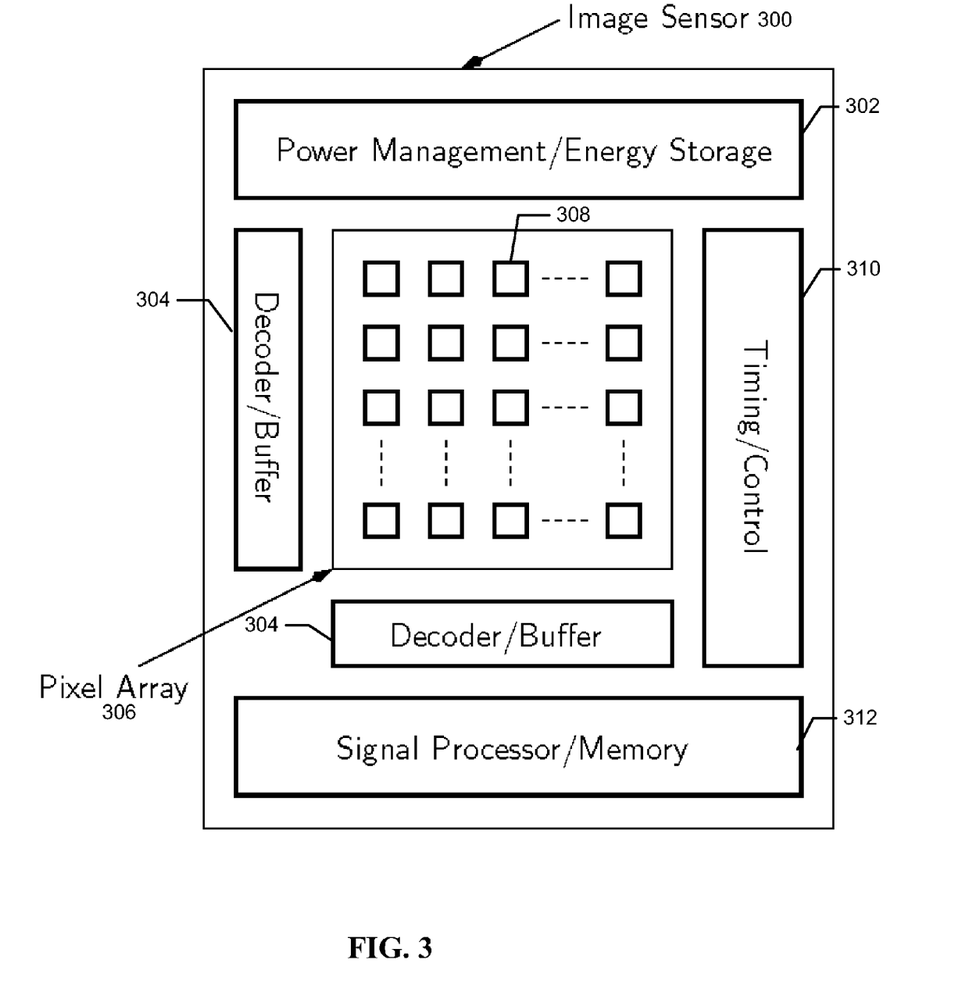
FIG. 3 depicts a block diagram of an imaging device for harvesting energy from integrated light sensing devices.

FIG. 3 depicts a schematic diagram of a CMOS imaging device 300 according to this embodiment. Imaging device 300 can be used in electronic imaging systems including, but not limited to cell phones, digital cameras, PDAs, remote sensing devices, medical imaging devices, etc., which are suitable for generating digital images. Imaging device 300 can also be integrated in wireless sensor networks including, but not limited to, imaging sensor networks for security and surveillance applications. Unlike conventional imaging device, the imaging device 300 not only captures digital images, but also harvests energy from the incident light and contributes to power supply, thereby reducing power consumption from the main power source used to power the device 300.

In particular, the image device 300 includes a pixel array 306, a timing and control unit 310, one or more decoder and buffer units 304, a signal processor and memory unit 312, and a power management and energy storage unit 302. The pixel array 306 can be one-dimensional or two-dimensional, in which pixels 308 convert the incident light with different illumination levels to electrical signals for further storage or processing.

Each pixel 308 is a sensing unit consisting of at least one photodiode, and a plurality of transistors fabricated using the CMOS technology. Each pixel 308 has a first operating mode (i.e., the sensing mode), where the photodiode or photodiodes sense the illumination level (i.e., intensity) and generate electrical charge in response to the incident light.

The charging process (commonly known as integration) is determined in part by the intensity and exposure time of each pixel 308. In general, the higher the incident intensity, the faster the electrical charge is generated. On the other hand, the longer the exposure time (integration time), the higher the electrical charge. Consequently, the time interval required for the electrical charge to reach a predetermined charge level is inversely proportional to the incident light intensity. As a result, the charging process of each pixel 308 is time encoded and the integration time required for each pixel 308 to reach a predetermined charge threshold can be decoded to calculate the intensity of the light received by each pixel 308.

In addition, the pixel 308 can be configured to harvest energy from the incident light. The transistors integrated in the pixel provide reset, control, readout, as well as other necessary functions. The timing and control unit 310 provides global clock signals for the sensor, and controls the operation of the entire sensor. The clock and control signals are distributed to other components by proper routing. The decoder and buffer units 304 are electrically coupled to the pixel array 306.

They are provided to address and access the signals generated by the pixel array 306, and load them into the signal processor and memory unit 312, which is electrically connected to the decoder and buffer units 304. The signal processor includes one or more digital processor, image encoders and decoders, analog-to-digital converters, calibration circuitries, etc. The memory includes both volatile and non-volatile memories. The signals generated by the pixel array 306 can be directly loaded into the processor for image processing such as image compression, and the processed signals are stored in the Memory.

The power management and energy storage unit 302 is electrically connects to the pixel array 306 and other circuit components for supplying them with electrical power. In addition, the power management and energy storage unit 302 also regulates and stores the energy harvested by the pixel array 306. Specifically, the power management and energy storage unit 302 can include step-up or step-down switching regulators, switch-capacitor power converters, low-dropout regulators, chargers, and other power conversion circuitry. Energy storage is realized by using on-chip capacitors or other CMOS compatible charge storage devices. The harvested energy can be used to complement the main power source (not shown) and used to power the pixel array 306, other circuit components within the image sensor, or other circuits external to the sensor. Alternatively, the energy hardest by the sensor array 306 can be stored in on-board or external energy storage devices.

Figure 4:
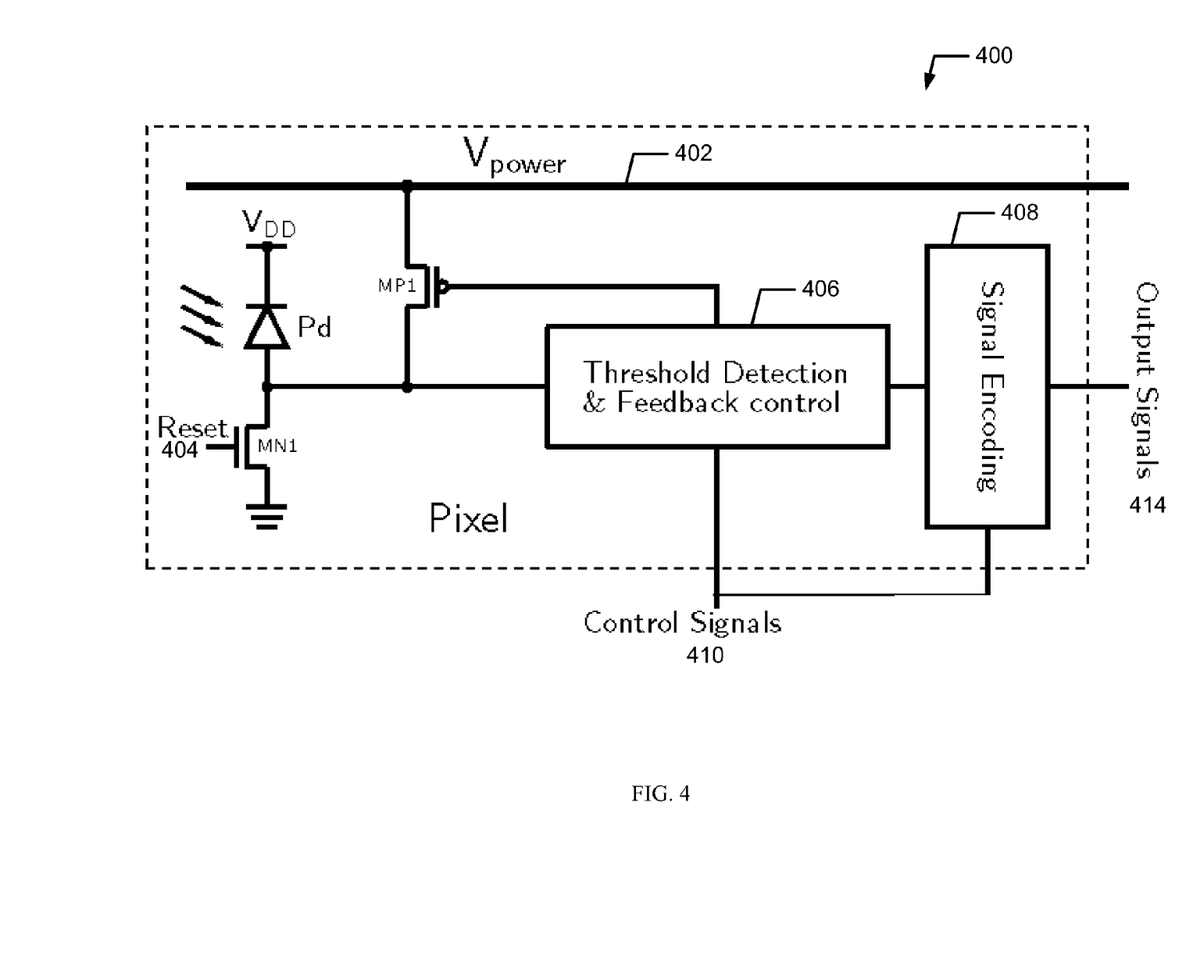
FIG. 4 shows a structure of a sensor element integrated in the imaging device depicted in FIG. 3.

FIG. 4 illustrates a structure diagram 400 of the pixel 308 according to some embodiments. The pixel 400 is connected to a voltage source VDD and includes a reset transistor MN1, a photodiode Pd, a switch transistor MP1 connecting the anode of the photodiode Pd to a power bus 402, which provides power supply Vpower from a main power source (now shown) and is shared by the entire pixel array 306, a threshold detection and feedback control unit 406, and a signal encoding unit 408.

The pixel 400 has two operating modes: a sensing mode (first mode) and an energy harvesting mode (second mode). In the sensing mode, the photodiode Pd is used to measure the incident light intensity using a timing coding technique. In the energy harvesting mode, the photodiode is used to harvest energy from the incident light received by the photodiode and to contribute to the power supply on the main power bus 402. The operation of the pixel 400 is described below.

Initially, the sensor is in harvesting mode. The reset transistor MN1 is off and the switch transistor MP1 is on. The anode of the photodiode Pd is connected to the main power bus 402 through the switch transistor MP1. When the pixel 400 is exposed to illumination, the photodiode Pd converts the incident photons into electron/hole pairs, thus forming photocurrents, to charge up the main power bus 402 to VDD'. Note the difference between VDD' and VDD is the open circuit voltage of the photodiode Pd.

When the integration process (the sensing mode) begins as indicated by the timing and control circuit 310 through the control signals 410, MP1 is turned off and MN1 is turned on by reset signal 404. The node connecting the anode of Pd and the drain of MN1 is discharged to ground. During the integration process of the pixel's normal operation mode, transistors MN1 and MP1 are turned off. The threshold detection and feedback control unit 410 monitors the voltage at the node connecting the anode of Pd and the drain of MN1.

Once the voltage reaches a predetermined threshold, the threshold detection and feedback control unit 406 sends a control signal to turn on MP1, thereby connecting the anode of Pd to the main power bus 402, which is shared by the pixel array 306. Accordingly, the pixel 400 goes into the energy harvest mode, where the photodiode Pd is used to harvest energy from the incident light. The photodiode Pd continues to convert the incident light into electrical charge, which is used to contribute to the power supply on the main power bus 402. The harvested energy can be used by the pixel 308, other pixels, or other circuits within or external to the image sensor 300, or be stored in energy storage devices such as on-board capacitors or external rechargeable batteries.

Unlike conventional voltage domain readout methods, the incident light intensity received by the pixel 408 is encoded by the interval from the beginning of the integration process (the sensing mode) to the time when the predetermined threshold is reached by the electrical charge generated by the photodiode Pd. As discussed above, this charging time interval is inversely proportional to the light intensity received by the photodiode Pd. The signal encoding unit 408 generates a time-encoded signal 414 and places it on the output line for read-out. After some duration, MP1 is turned off, and the sensor enters harvesting mode and waits for the next integration cycle.

Figure 5:
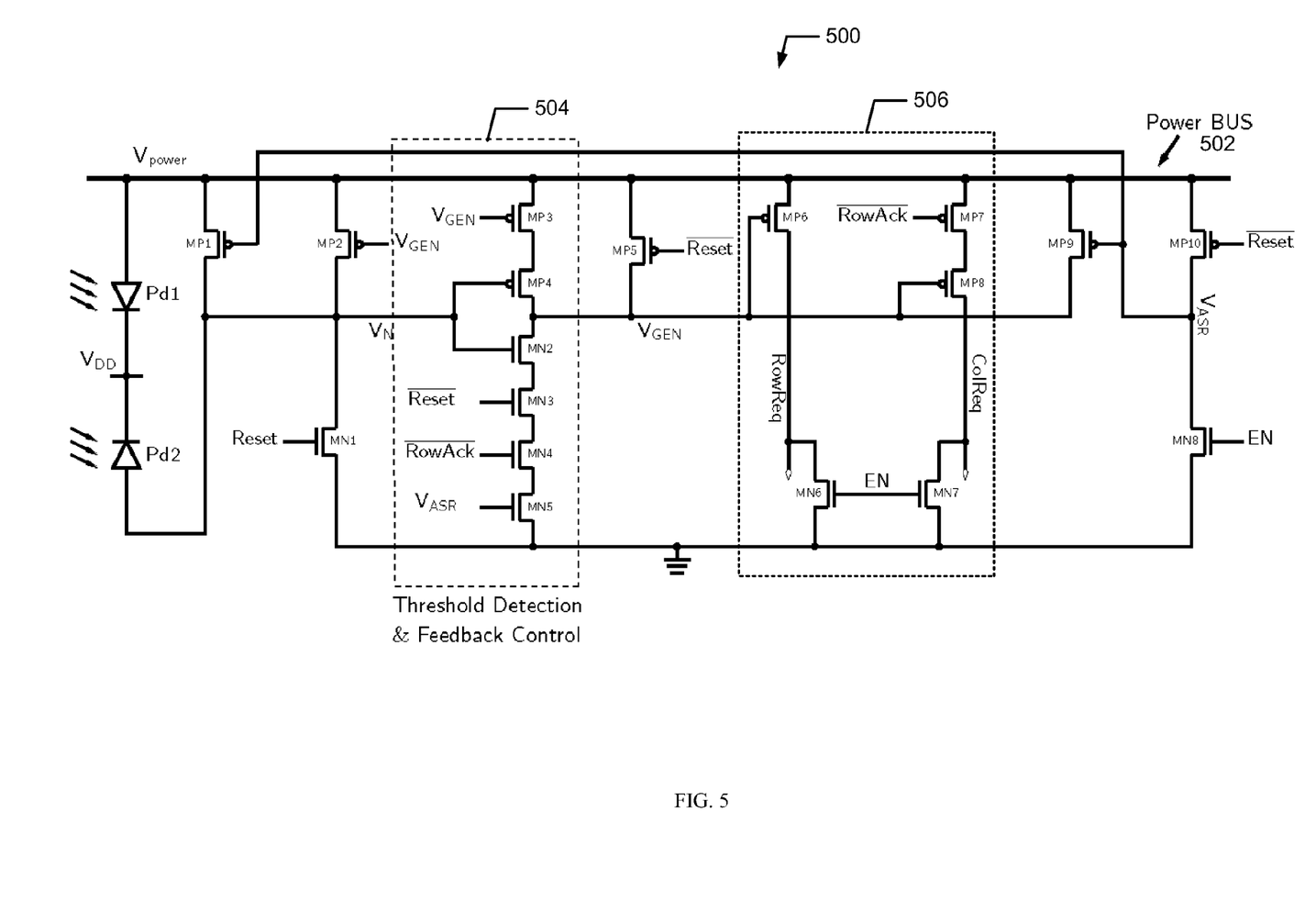
FIG. 5 shows a circuit implementation of the sensor element depicted in FIG. 4.

FIG. 5 shows another implementation 500 of the pixel element 308 depicted in FIG. 3. In particular, the pixel element 500 shown in FIG. 5 is connected to a voltage source VDD. The pixel 500 includes two photodiodes (Pd1 and Pd2), 10 PMOS transistors, and 8 NMOS transistors. Pd1 acts as an energy harvesting device and continuously generates power, whereas Pd2 is switched between the sensing mode and the energy harvesting mode similar to the pixel 400 depicted in FIG. 4.

In particular, MN1 is the reset transistor, and MP1 and MP2 connect the anode of Pd2 to the main power bus 502 shared by the pixel array 306. Transistors MN2-5 and MP2-4 form the threshold detection and feedback control unit 504 similar to 406. Transistors MN6-7 and MP6-8 form the signal encoding unit 506 for implementing the signal read-out. Transistors MN8, MP5, and MP9-10 are switches for controlling the operations of the pixel 500. $V_N$ is the voltage at the sensing node of the photodetector Pd2, and $V_{GEN}$ is the output of the threshold detection and feedback control unit 504. The threshold detection and feedback control unit 504 monitors $V_N$ and compares it with a threshold voltage which is set by the inverter formed by MN2 and MP4.

Once the threshold voltage is reached, $V_{GEN}$ is pulled down, thus turning on MP6 and MP8. Output line RowReq is then pulled up and sent to the timing and control unit 310 for processing. After some duration, $\overline{RowAck}$ signal is sent back to turn on MP7, and output line ColReq is pulled up and also sent to the timing and control unit 310. As discussed above, the incident light intensity information is encoded into the pulses of output signals, RowReq and ColReq. The $V_{ASR}$ signal is asynchronously enabled by EN, which is a control signal from the timing and control unit 310 to refresh the pixel 500, after the electrical charge at the sensing photodiode Pd2 reaches the threshold and is used to distinguish between the sensing and energy harvesting modes of the pixel 500.

The operation principle of the circuit 500 shown in FIG. 5 can be divided into two phases: the energy harvesting mode and the sensing mode.

In the energy harvesting mode, the pixel is used to harvest energy from ambient light. Assuming the voltage Vpower on the main power bus 502 is initially zero, when the pixel is exposed to the incident illumination and the energy generation process begins, Pd1 converts the incident photons into electron/hole pairs, thus forming photocurrents, to provide extra power onto the main power bus 502. After some duration, Vpower is fully charged up to VDD', where the difference between VDD' and VDD is given by the open circuit voltage of the Pd2. Maximum energy is harvested once Vpower reaches VDD'.

During the energy harvesting mode, the Reset signal is kept low and $\overline{\text{Reset}}$ remains high, thereby isolating the timing and control unit 310 from the pixel array 306 and keeping $\overline{\text{RowAck}}$ low. At the same time, the EN signal is kept high in order to pull down the request lines RowReq, ColReq and $V_{ASR}$. Since at this stage $V_{ASR}$ is low, the photodetector Pd2 is connected to the main power bus 502, thus contributing to power supply.

In the sensing mode, for normal operation of the photodetector Pd2, signal EN first changes to low, turning off MN8 and thus isolating $V_{ASR}$ from the ground. An active low pulse $\overline{\text{Reset}}$ is then generated slightly earlier than the active-high pulse Reset. The $\overline{\text{Reset}}$ pulse connects the main power bus 502 and $V_{ASR}$, thereby pulling up $V_{ASR}$ and switching off transistor MP1. At this stage, the photodetector Pd2 is cut off from the main power bus 502. The Reset pulse then discharges the voltage $V_N$ of the photodetector Pd2 and initiates the integration process.

In the sensing mode, Pd2 operates as the photodetector, charging $V_N$ by its photocurrent proportionally to the illumination level. When $V_N$ is charged up to the threshold voltage set by the threshold detection and feedback control unit 504, $V_{GEN}$ is switched off quickly. As $V_{GEN}$ changes to low, MP6 and MP8 are turned on, thus enabling RowReq (charged up by Vpower). The RowReq signal is sent to the arbitration block in the timing and control circuit 310 for further processing.

Figure 6:
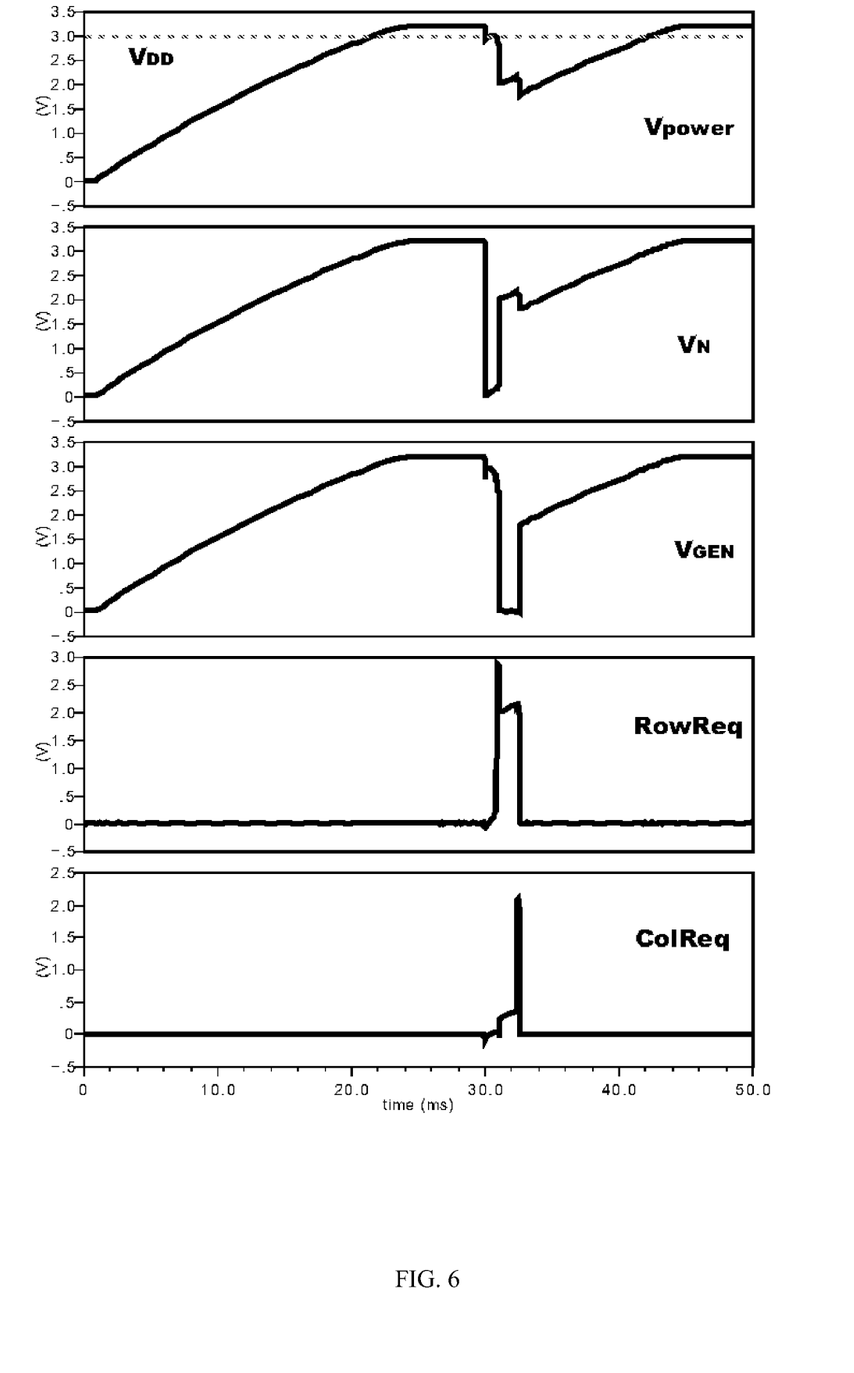
FIG. 6 shows the signal waveforms of the sensor element circuit depicted in FIG. 5 during its operation.
Figure 7A:
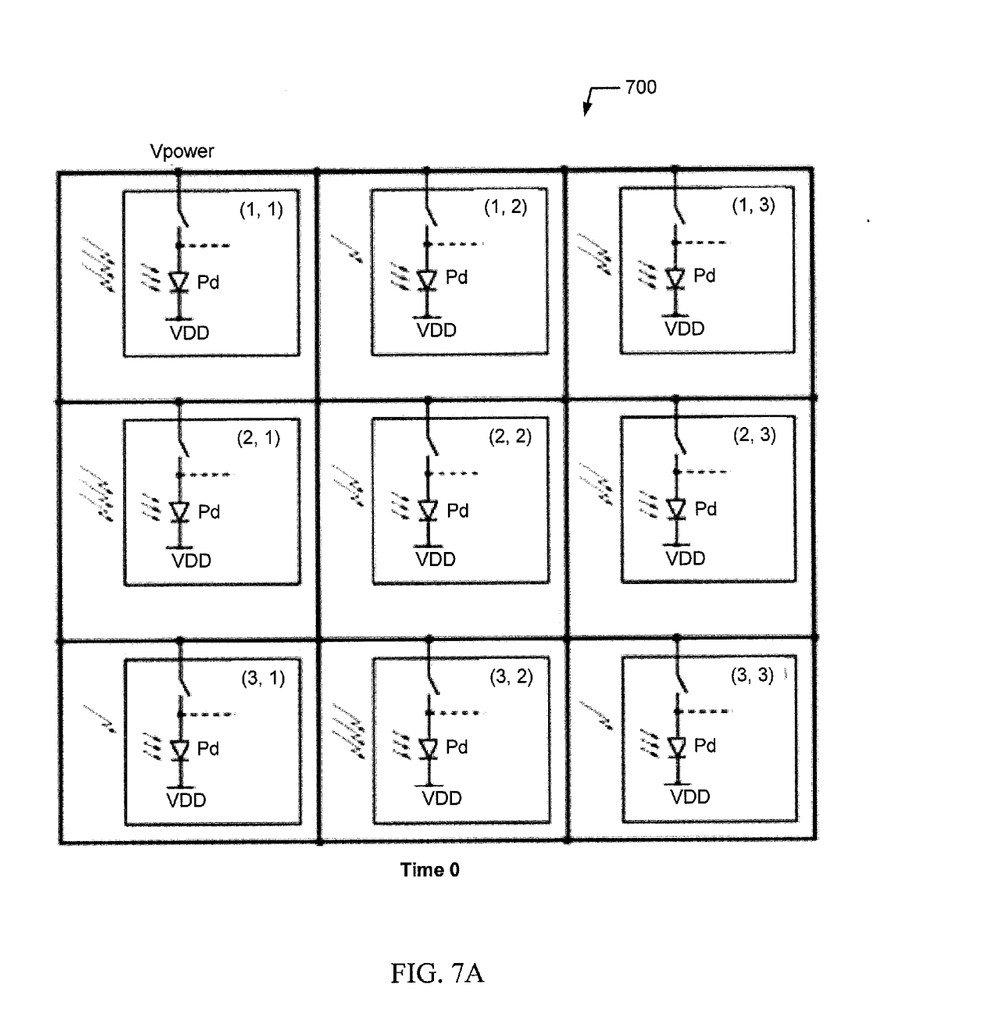
FIG. 7 illustrates an asynchronous read-out technique for harvesting energy from a sensor array.
Figure 7B:
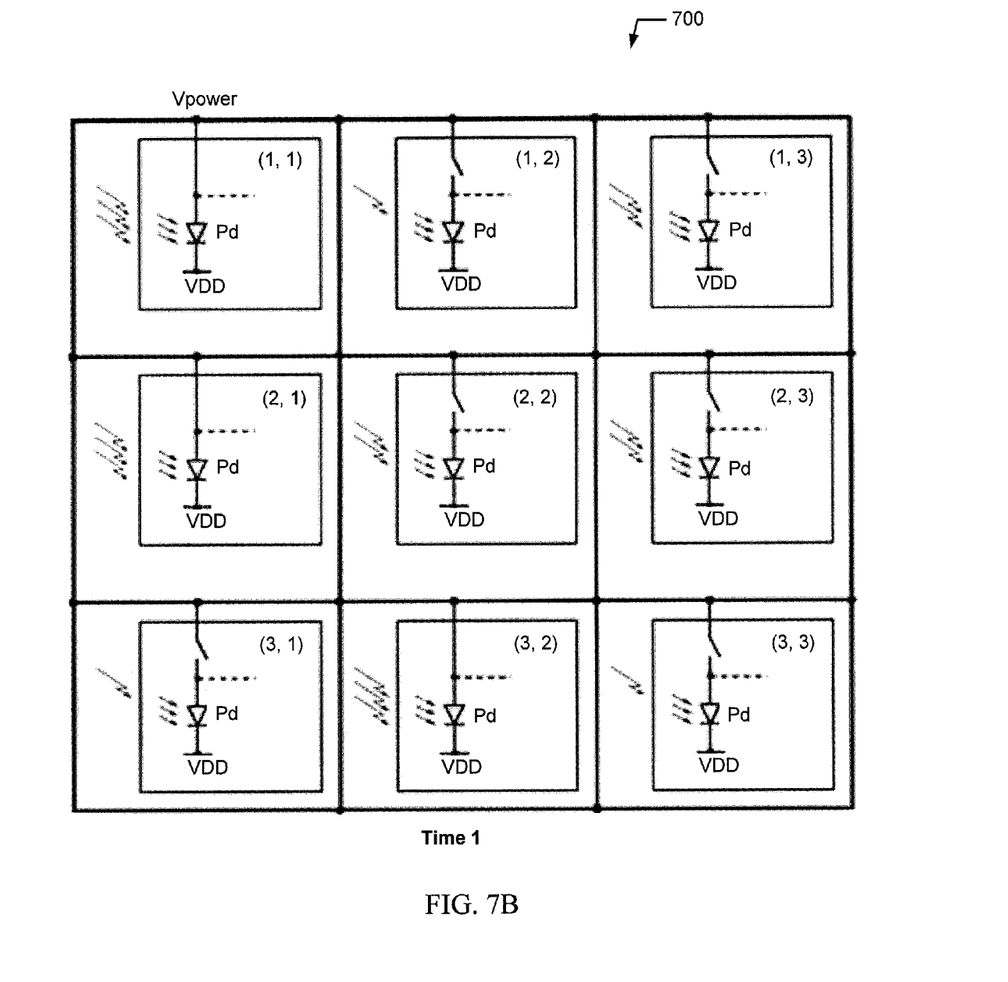
Figure 7C:
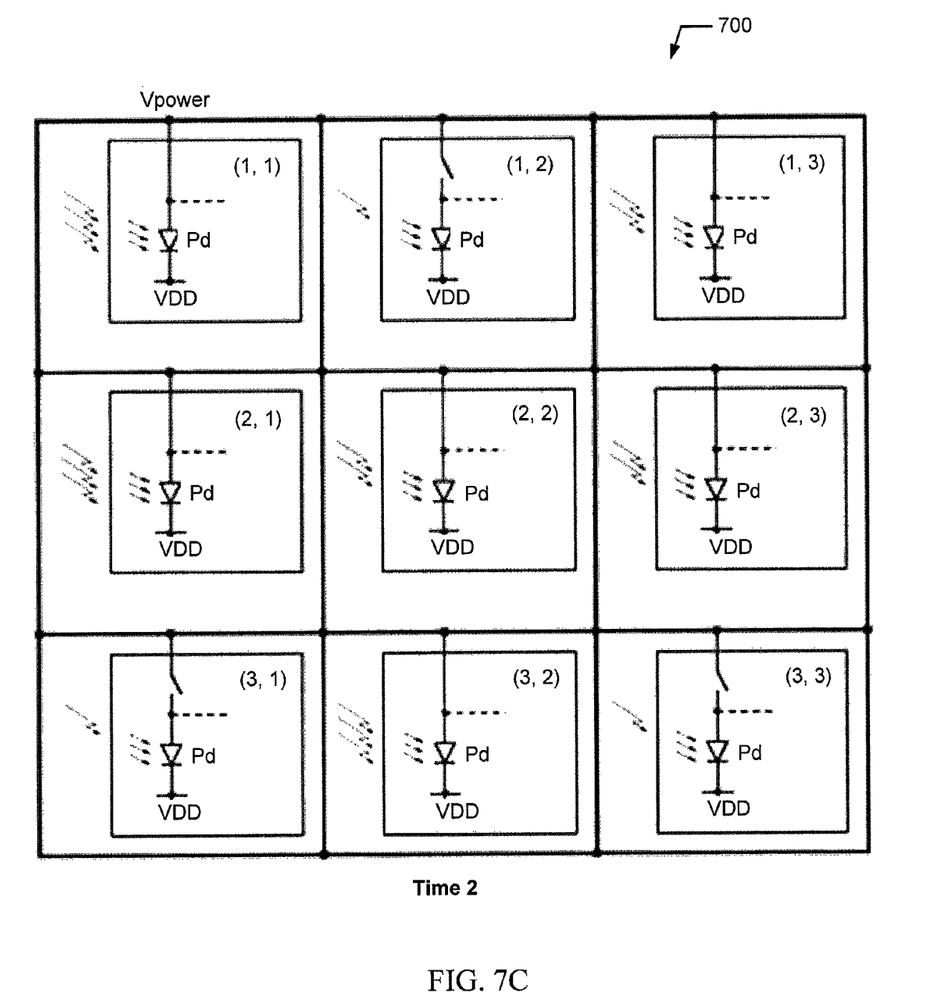
Figure 7D:
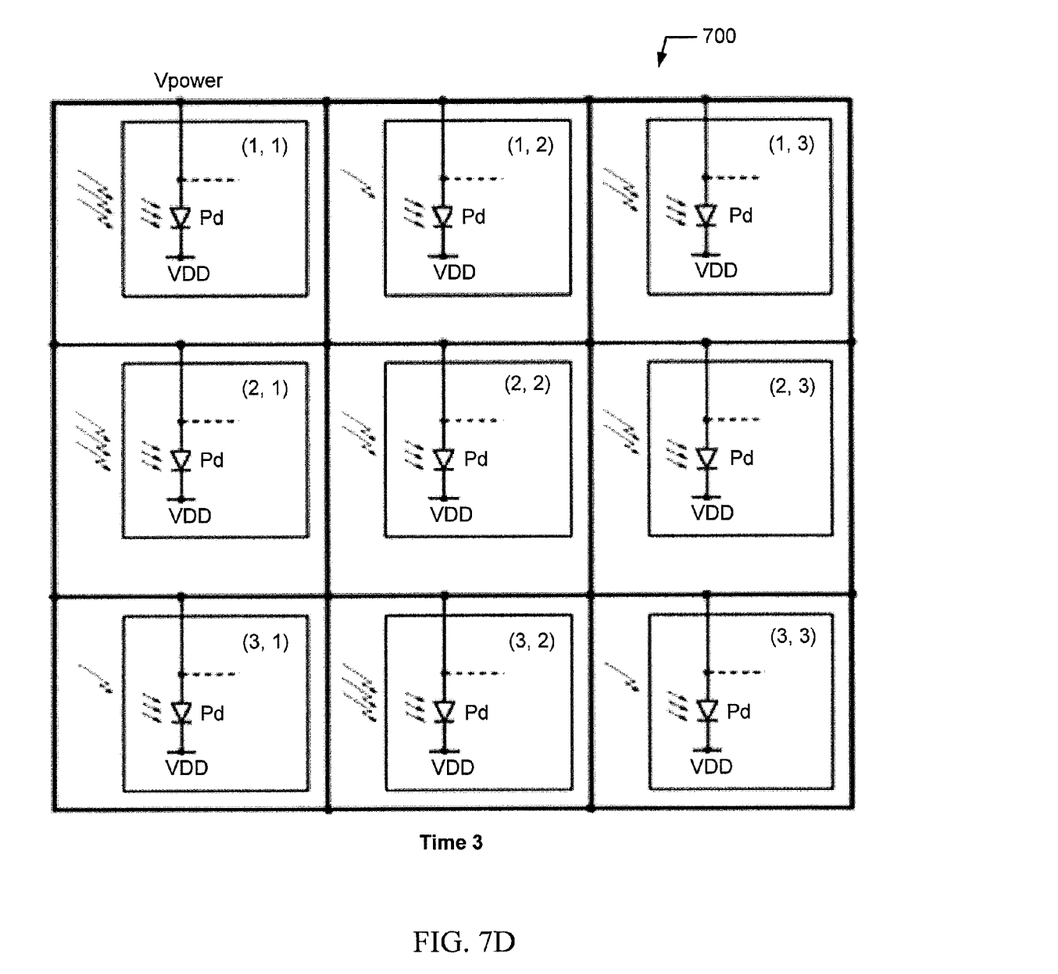

The $\overline{\text{RowAck}}$ signal sent back to the pixel 500 will turn on transistor MP7. Since MP8 is already on, ColReq is pulled high and the ColReq signal is sent to the timing and control unit 310 for processing. After a period of processing, the EN signal is pulled up, thus turning on MN6-8. At this stage, the $V_{ASR}$ signal is pulled down again, turning on MP1 and MP9, thus connecting $V_{GEN}$ to the main power bus 502 and clearing $V_{GEN}$. The switching of the EN signal from low to high controls the pixel 500 to switch from the sensing mode to the energy harvesting mode. Waveforms of the signals during the operations of pixel 500 are illustrated in FIG. 6.

FIG. 7 depicts the operations of an exemplary embodiment of the pixel array 700 including a 3 by 3 array. Each pixel in the pixel array 700 is similar to those depicted in FIGS. 4 and 5. Under the control of circuits similar to the timing and control unit 310, the pixel array 700 can be used to generate digital images as well as harvest energy from the incident lights by utilizing the asynchronous pixels.

Specifically, each pixel in the array 700 has an active mode (sensing mode) and a stand-by mode (energy harvesting mode), which are triggered asynchronously according to the local incident light intensity. In the sensing mode, the pixel draws power from a main power source through a main power bus, whereas in the stand-by mode the pixel generates energy and contributes to the main power supply for powering the operations of other pixels that are sill in the sensing mode.

After the integration process, the output signals are readout and the pixel enters the standby mode and the corresponding photodetector or photodetectors of the pixel are connected to the main power bus. The pixel continues to generate electrical charge to provide extra power supply onto the main power bus, thereby reducing the power consumption drawn from the main power source.

As discussed above, the integration process of a photodetector is proportional to the incident light intensity. As a result, highly illuminated pixels charge up quickly and the output signals are read out from these pixels first, due to the fact that the electrical charge reaches the predetermined threshold earlier in these pixels than in other pixels receiving lower illumination levels. Once the output signals are collected, these highly illuminated pixels are configured to harvest energy at earlier times that those pixels exposed to lower illumination levels. When a group of pixels are switch to the energy harvesting mode, the electrical charge in these pixels is used to contribute to the main power supply, thereby reducing power consumption from the main power source. As remaining active pixels continue to charge up, more and more active pixels are switched to the energy harvesting mode, thereby creating an avalanche effect. Consequently, the extra power generated by the pixel array continues to increase and the power consumption drawn from the main power source continues to decrease.

As shown in FIG. 7, the illumination level of the incident light is indicated by the number of arrows, as higher number of allows indicates stronger incident light. When all of the pixels in the array 700 have similar threshold level, a pixel receiving higher illumination reaches the threshold earlier and thus ends the integration stage earlier than one receiving lower illumination. As time goes by (from Time 0 to Time 3), the pixels switch from the sensing mode to the energy harvesting mode in the following sequence:

Time 1: pixels (1, 1), (2, 1), and (3, 2) switch;
Time 2: pixels (1, 3), (2, 2), and (2, 3) switch; and
Time 3: pixels (1, 2), (3, 1), and (3, 3) switch.

As can be seen, highly illuminated pixels (e.g., pixels 1, 1), (2, 1), and (3, 2)) switch first and hence contributing their harvested energy at an earlier stage. The pixels with lower illumination follow as these pixels continue to charge up. As a result, highly illuminated pixels can harvest energy for a longer time, and more energy can be scavenged from these pixels as other pixels continue the integration process. An efficient energy harvesting scheme is therefore obtained. This cannot be achieved by conventional APS, where pixels are operated sequentially using a clock signal, irrespective to their illumination level.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for operating a sensor array comprising a plurality of sensor elements, comprising:
   setting the plurality of sensor elements in a sensing mode for measuring an environmental characteristic by generating electrical charges in response to the environmental characteristic;
   generating a plurality of sensor element output signals in response to the electrical charges;
   comparing the electrical charges generated by the plurality of sensor elements to a predetermined threshold;
   asynchronously switching the plurality of sensor elements to an energy harvesting mode for harvesting electrical charge generated in response to the environmental characteristic for supplying power to the sensor array, wherein each sensor element is switched to the energy harvesting mode when the electrical charge corresponding to the sensor element reaches the predetermined threshold.

2. The method of claim 1, wherein each sensor element includes an integrated photoelement for converting light into electrical charge and the environmental characteristic includes a light intensity.

3. The method of claim 1, wherein each sensor element includes a piezoelectric sensor and the environmental characteristic includes at least one of a pressure, an acceleration, and a strain.

4. The method of claim 1, wherein the output signal of a sensor element is encoded with a charging time, wherein the charging time is the time required to reach the predetermined threshold based on the environmental characteristic measured by the sensor element.

5. The method of claim 1, further comprising:
   providing a reset signal to the sensor array; and
   switching the plurality of sensor elements from the energy harvesting mode to the sensing mode in response to the reset signal.

6. An apparatus comprising:
   a sensor array comprising a plurality of sensor elements, the plurality of sensor elements being configured to be operated in a sensing mode and an energy harvesting mode, wherein the plurality of sensor elements measure an environmental characteristic in the sensing mode by generating electrical charges in response to the environmental characteristic, and wherein the plurality of sensor elements harvest electrical charge generated in response to the environmental characteristic for supplying power to the apparatus in the energy harvesting mode;
   one or more control circuits connected to the plurality of sensor elements for monitoring the generated electrical charges and for generating a feedback signal for asynchronously switching the plurality of sensor elements from the sensing mode to the energy harvesting mode, wherein each sensor element is switched to the energy harvesting mode when the monitored electrical charge corresponding to the sensor element reaches a predetermined threshold; and
   one or more encoding circuits connected to the one or more control circuits for generating output signals in response to the monitored electrical charges.

7. The apparatus of claim 6, wherein each sensor element comprises an integrated photoelement for receiving and converting light into the electrical charge.

8. The apparatus of claim 7, wherein the sensor array is configured to receive a reset signal for initializing the sensing mode.

9. The apparatus of claim 8, wherein each sensor element further comprises a bias transistor connected in series with the integrated photoelement, and wherein the reset signal turns on the bias transistor for draining electrical charge on the integrated photoelement to a ground.

10. The apparatus of claim 9, wherein the one or more control circuits include a plurality of switch transistors for switching the plurality of sensor elements between the sensing mode and the energy harvesting mode.

11. The apparatus of claim 10, wherein each switch transistor is connected in series with the integrated photoelement and a power bus.

12. The apparatus of claim 10, wherein the one or more control circuits are configured to switch each sensor element to the energy harvesting mode by turning on the switch transistor, connecting the integrated photoelement to the power bus.

13. The apparatus of claim 12, wherein electrical charge generated by an individual sensor element is used to power elements of the apparatus other than the individual sensor element through the power bus.

14. The apparatus of claim 10, wherein the one or more control circuits are configured to switch each sensor element to the sensing mode by turning off the switch transistor, disconnecting the integrated photoelement from the power bus.

15. An imaging device, comprising:
   a sensor array comprising a plurality of sensor elements, each sensor element having a sensing mode and an energy harvesting mode, wherein each sensor element is configured to generate an output signal indicative of a light intensity received by the sensing element in the sensing mode, and is configured to harvest energy for supplying power to the imaging device in the energy harvesting mode;
   timing and control circuitry for providing control signals to switch each sensing element between the sensing mode and the energy harvesting mode, wherein the timing and control circuit is further configured to asynchronously switch the plurality of sensor elements from the sensing mode to the energy harvesting mode, wherein each sensor element is switched from the sensing mode to the energy harvesting mode when a monitored electrical charge corresponding to the sensor element reaches a predetermined threshold; and
   a processing circuit for selectively reading the output signals from the sensor array.

16. The imaging device of claim 15, wherein each sensing element further comprises:
   an integrated light sensor for converting light to electrical charge;
   a control circuit, part of the timing and control circuitry, for monitoring the electrical charge corresponding to the sensing element and for generating a feedback signal to switch the sensing unit from the sensing mode to the energy harvesting mode when the electrical charge reaches the predetermined threshold; and an encoding circuit for generating the output signal corresponding to the sensing element based on a charging time of the sensing unit.

17. The imaging device of claim 16, wherein a charging time for an individual sensing element to reach the predetermined threshold in the sensing mode is inversely proportional to the light intensity received by the sensing element.

18. The imaging device of claim 15, wherein the processing circuit is further configured to form an image based on the output signals collected from the sensor array.

19. The imaging device of claim 15, further comprising:

a power management unit for maintaining a substantially consistent global power supply when the sensing elements are switched between the sensing mode and the energy harvesting mode; and an energy storage unit for storing at least a portion of the electrical charge provided by the sensing elements operating in the energy harvesting mode.

20. The imaging device of claim 15, wherein power consumption from an external power supply is reduced when at least one of the sensing elements operates in the energy harvesting mode.

21. The imaging device of claim 20, further comprising:
an energy storage device electrically coupled to the sensor array for storing the electrical charge generated by the sensing elements in the energy harvesting mode.

22. The imaging device of claim 21, wherein the energy storage device provides electrical power through the power management unit to the imaging device.

23. The imaging device of claim 22, wherein the energy storage device provide energy to the other circuits.

24. The imaging device of claim 21, wherein the energy storage device includes at least one of a capacitor and a rechargeable battery.

25. The imaging device of claim 15, further comprising:
a decoder and buffer unit; and
a memory unit.

26. The imaging device of claim 15, wherein the imaging device is fabricated using a Complementary Metal-Oxide Semiconductor (CMOS) technique.

27. The imaging device of claim 15, wherein the sensor array includes one of a one-dimensional array of sensing elements and a two-dimensional array of sensing elements, wherein the sensing elements correspond to pixels, and wherein each pixel includes at least one photoelement.

28. The imaging device of claim 15, further comprising energy harvesting elements that only operate in the energy harvesting mode.

* * * * *